United States Patent [19]

Pinkston

[11] Patent Number: 5,146,160

[45] Date of Patent: Sep. 8, 1992

[54] AUXILIARY POWER UNIT TEST KIT

[76] Inventor: Rodney G. Pinkston, HHC 1/68 Armor, APO, N.Y. 09026

[21] Appl. No.: 576,828

[22] Filed: Sep. 4, 1990

[51] Int. Cl.$^5$ .............................................. G01R 31/00
[52] U.S. Cl. ................................... 324/158 R; 322/99; 324/158 MG; 340/648
[58] Field of Search ........... 324/158 MG, 158 R, 511, 324/537; 322/99; 340/648

[56] References Cited

U.S. PATENT DOCUMENTS

| | | | |
|---|---|---|---|
| 3,300,713 | 1/1967 | Fulton | 324/384 |
| 3,452,276 | 6/1969 | Behrendt | 324/407 |
| 4,176,350 | 11/1979 | Patterson | 340/648 |
| 4,301,396 | 11/1981 | Bourke | 340/648 |
| 4,354,182 | 10/1982 | Frey | 322/99 |
| 4,445,047 | 4/1984 | Cannon | 324/158 MG |
| 4,682,103 | 7/1987 | De Nardis | 322/99 |
| 4,739,184 | 4/1988 | Onesti | 324/158 MG |

FOREIGN PATENT DOCUMENTS

| | | | |
|---|---|---|---|
| 0019864 | 12/1980 | European Pat. Off. | 322/99 |
| 2744499 | 4/1979 | Fed. Rep. of Germany | 322/99 |
| 3512110 | 10/1986 | Fed. Rep. of Germany | 340/648 |
| 2112596 | 5/1987 | Japan | 340/648 |

OTHER PUBLICATIONS

"Automotive Charging Regulator Gives Overvoltage and Undervoltage Warnings", by Okolowicz, *Electronic Design*, vol. 24, #6, p. 104, Mar. 1976.

*Primary Examiner*—Kenneth A. Wieder
*Assistant Examiner*—William J. Burns
*Attorney, Agent, or Firm*—Peter A. Taucher; Gail S. Soderling

[57] ABSTRACT

The invention relates to a test and repair test kit for auxiliary power units for military vehicles. The test and repair test kit allows the easy diagnosis of problems and the ability to verify their repair on a mobile platform without the need of the vehicle. The test and repair test kit is self contained and provides the auxiliarry power unit with fuel and power allowing the complete operation of the auxiliary power unit. Repairs of the auxiliary power unit are facilitated because the operator is allowed easy access to major components while attached to the test and repair stand.

1 Claim, 3 Drawing Sheets

AUXILIARY POWER UNIT TEST KIT

GOVERNMENT INTEREST

The invention described herein may be manufactured, used, and licensed by or for the Government for governmental purposes without payment to me of any royalty thereon.

BACKGROUND AND SUMMARY

This invention relates to an engine test kit for auxiliary power units of the type commonly used on tracked military vehicles. Auxiliary Power Units (APUs) are generally small diesel engines in the 2 to 20 horsepower range and they are equipped with a D.C. starter-generator to charge the vehicle's batteries and operate the electrical system. APUs are also equipped with a hydraulic pump capable of operating the vehicle's hydraulic system.

The vehicle electrical and hydraulic systems do not require a significant portion of the main engine's power output; typically less than 5%, so normally the vehicle electrical and hydraulic systems are powered by the main engine. When the vehicle is stationary, most of the main engine's power is wasted. During these stationary periods, it is much more fuel efficient to operate the electrical and hydraulic systems with the smaller and more efficient APU than with the main engines. The APU can operate both the electrical and hydraulic systems to keep the vehicle in readiness without the need of operating the main engine. This significantly reduces the amount of noise emitted when the vehicle is in a quiet waiting state and also minimizes fuel consumption and main engine wear. Only when the vehicle is required to move is it necessary to operate the main engine.

On typical military vehicles such as the M88A1 Tracked Recovery vehicle and the M992 Tracked Ammunition Carrier, the APU is located within an armored portion of the vehicle in a relatively inaccessible location. Even rudimentary testing and maintenance requires complete removal of the APU from the vehicle. The current practice for maintaining and repairing the APU requires removal of the APU from the vehicle, and visually inspecting the APU for sign of a problem. If an obvious problem is found from the inspections, or if a likely problem is suggested from an operational failure, that part is repaired or replaced and the APU reinstalled in the vehicle. Not infrequently, the repaired APU fails to function properly when replaced in the vehicle necessitating reremoval and repair.

A common problem with APUs has been faulty fuel injector pumps. This invention allows such operating problems to be diagnosed without disassembly of the APU while the APU is out of the vehicle. Repair of the fuel injector pumps is usually performed with an inexpensive fuel injector repair kit. In the past, testing the repairs effectiveness required placing the APU back in the vehicle and trying to operate the APU. The repair process often required up to five removal, repair, replacement and test cycles of the APU before the APU operated properly. Using my invention, the APU can be repaired and one person can perform the testing necessary to check out the APU. This saves personnel time since testing the APU in a vehicle requires one person to operate the controls while a second person monitors gauges attached to the APU. This was cumbersome and presents a safety problem because the person monitoring the APU had to work near an operating engine in a cramped engine compartment.

The prior procedure required use of the vehicle to test the APU and determine if the repair was successful. This procedure created an additional burden in that the vehicle must be kept out of service while the repair is being performed.

The test kit of my invention eliminates the need to reinstall the APU in the vehicle merely to perform diagnostic testing on the APU or to verify the repair. The invention consists of a portable test kit useful to test and repair an APU which is held securely on a test stand. One test stand can be configured to accept a variety of APUs by having multiple attachment points or by having reconfigureable attaching brackets and the required electrical, fuel and hydraulic connections to provide the necessary components to operate and test the APU. Switches and gauges on the test kit operate and monitor the APU so that most if not all trouble shooting functions can be performed at the test stand.

The test kit of the present invention is designed to be small, light weight, and easily moveable to assist in the removal and installation process. The mobility of the test kit allows the operator to bring the test stand to the vehicle, remove the APU, and move the test kit and APU to a convenient location for making the repair. This greatly assists the diagnoses and repair process because the size and weight of tracked military vehicles makes moving them inside difficult. Using this invention, the vehicle can be put in a relatively open area, the APU removed, fixed to the test stand and the APU brought to a more convenient location for diagnoses and repair. This allows even small repair facilities to handle repairs of the APU. If necessary, the vehicle can operate without the APU or with a replacement APU since the vehicle is not necessary for testing.

DETAILED DESCRIPTION OF THE DRAWINGS

Figure 1:
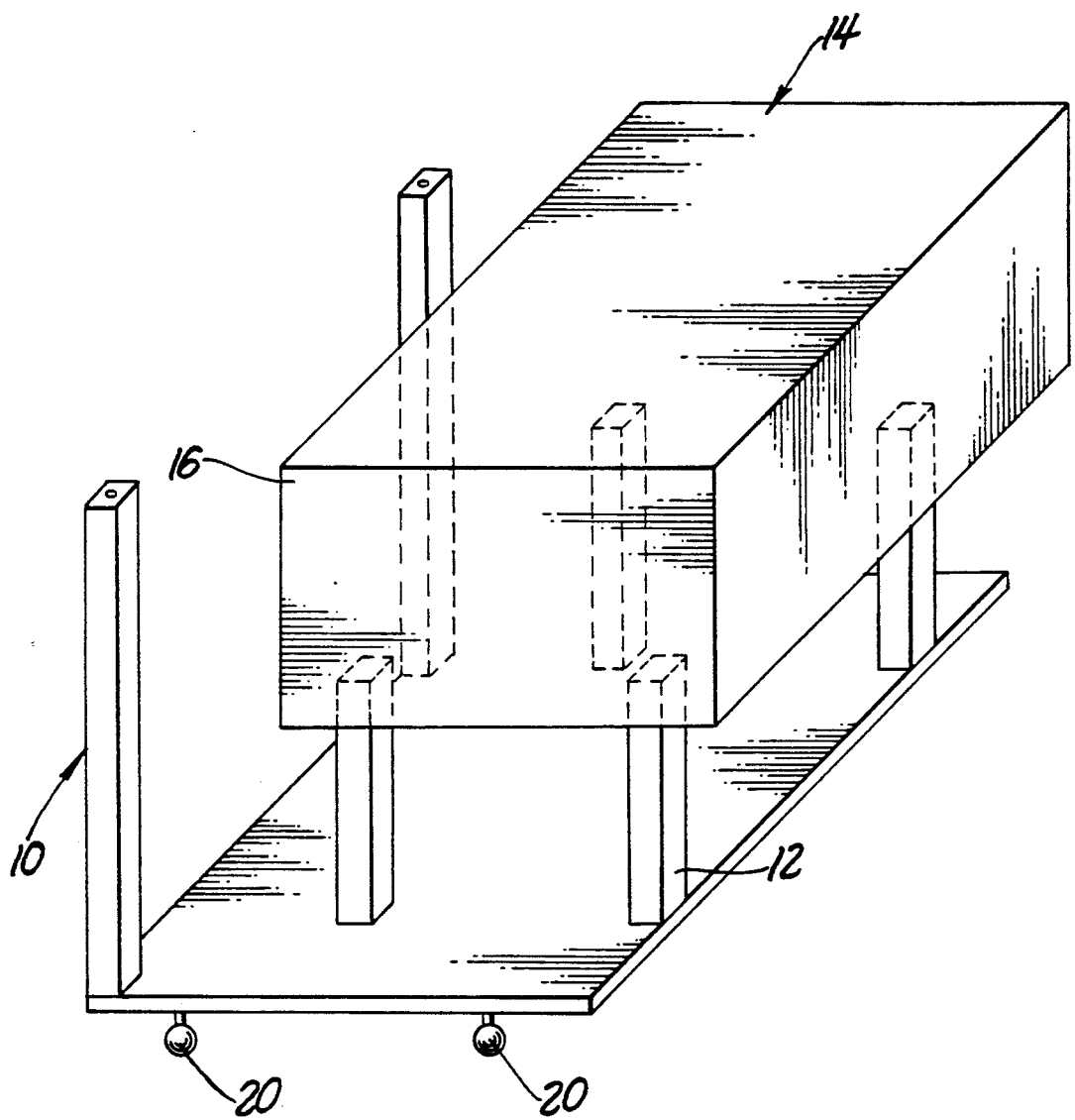
FIG. 1 is an isometric view of a test stand useful with the test kit of this invention with an APU shown as an outlined box.

In the accompanying drawing in which like numerals refer to like parts, and beginning with FIG. 1 the figure shows a test stand designated generally 10 having a plurality of vertically extending legs 12 designed to firmly hold an APU 14 during test and repair. The APU 14 is shown as a rectangular structure since the exact configuration will vary with the APU being tested. In the figure, the connections for the APU are shown on its front face 16 but it is understood that the connections could be located on any of the sides. The present representation allows greater clarity and ease of representation.

In greater detail, the test stand 10 has a base member 14 with four casters 20 depending from the lower surface. The casters 20 allow the test stand 10 and associated APU to be moved to a convenient location such as into a repair depot. The test stand 10 as shown has six legs 12 extending vertically from the base 18 four of the legs being depicted as equal in length and two of the legs being depicted as longer. The legs can have various brackets such as substitute motor mounts or studs which can be used to attach the APU 14 to the test stand. The exact configuration is not shown since the detail is not part of this invention and the design of mounting brackets is within the skill of the art given the APU to be mounted and its fixture connections.

Once the APU 14 has been securely fastened to the test stand 12 and moved to the desired location, a test kit 22 according to this invention is connected to the APU. The test kit comprises a housing 24 adapted to hold the components of the test kit. The upper surface 26 as shown is disposed at an angle to the horizontal to hold a row of gages in an easily read position and a row of switches in an easily accessible position. Connections are mounted on the housing so that the APU can be connected to the test kit and will receive load signals similar to those seen during actual operation. The connections, switches, and gages will be discussed further hereinafter.

A source of fuel such as a 5 gallon can of the appropriate fuel is connected to a fuel pump 28 mounted on one side of the housing 24 of the test kit 22 by a fuel line 30. The fuel pump output 32 is connected to the APU 16 and provides enough fuel for extended testing. The fuel pump 28 is adapted to provide sufficient capacity to run the small diesel engines which are the APUs.

The test kit itself is connected to an outside source of power by a connector 34 generally maintained at 24 volts for testing military vehicles. The outside power source, not shown, could be batteries, or any 24 volt military vehicle. This provides energy to start and run the APU and enables the APU generator to safely charge without causing cross current.

Figure 2:
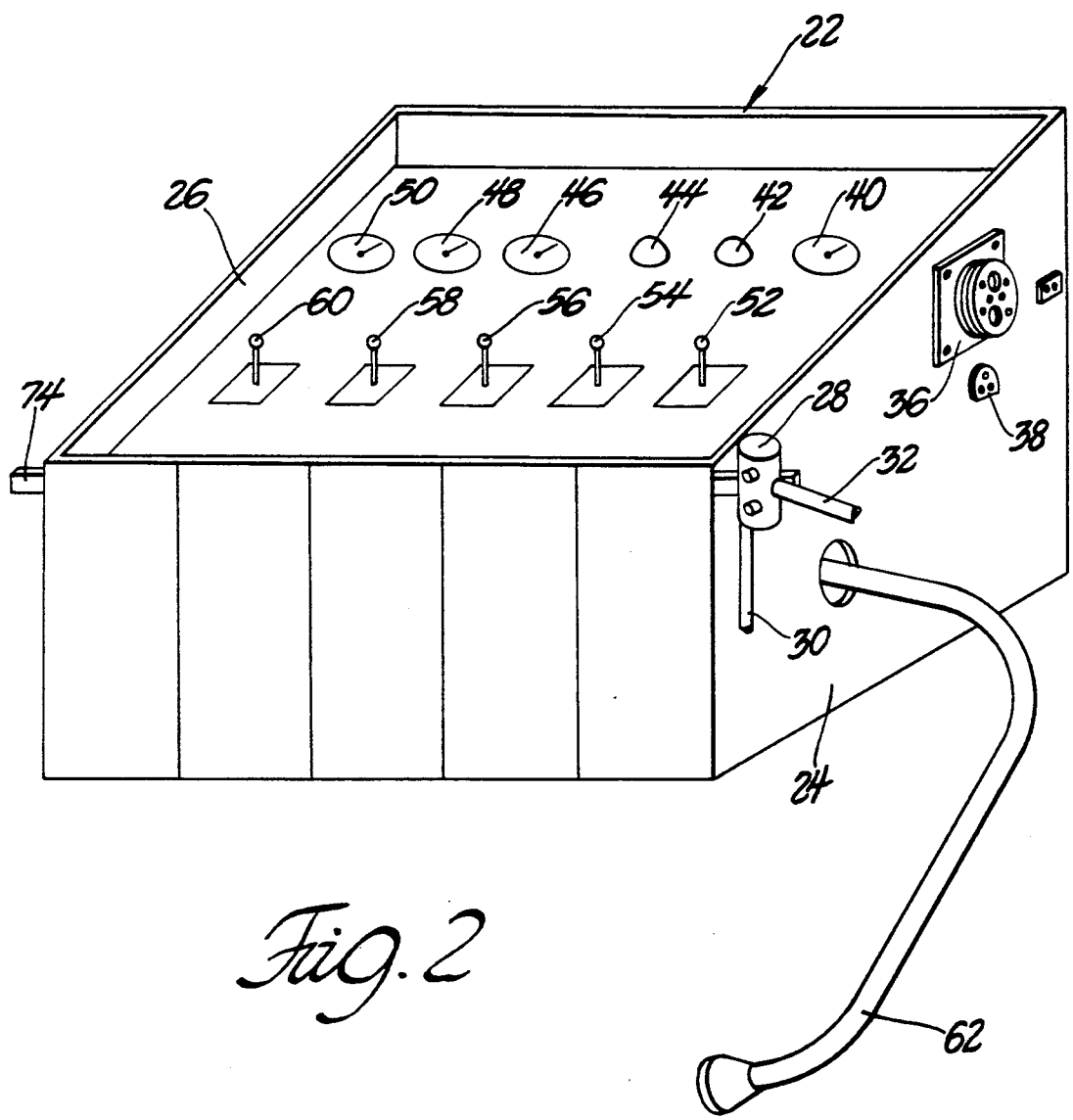
FIG. 2 is an isometric view of a test kit according to this invention.
Figure 3:
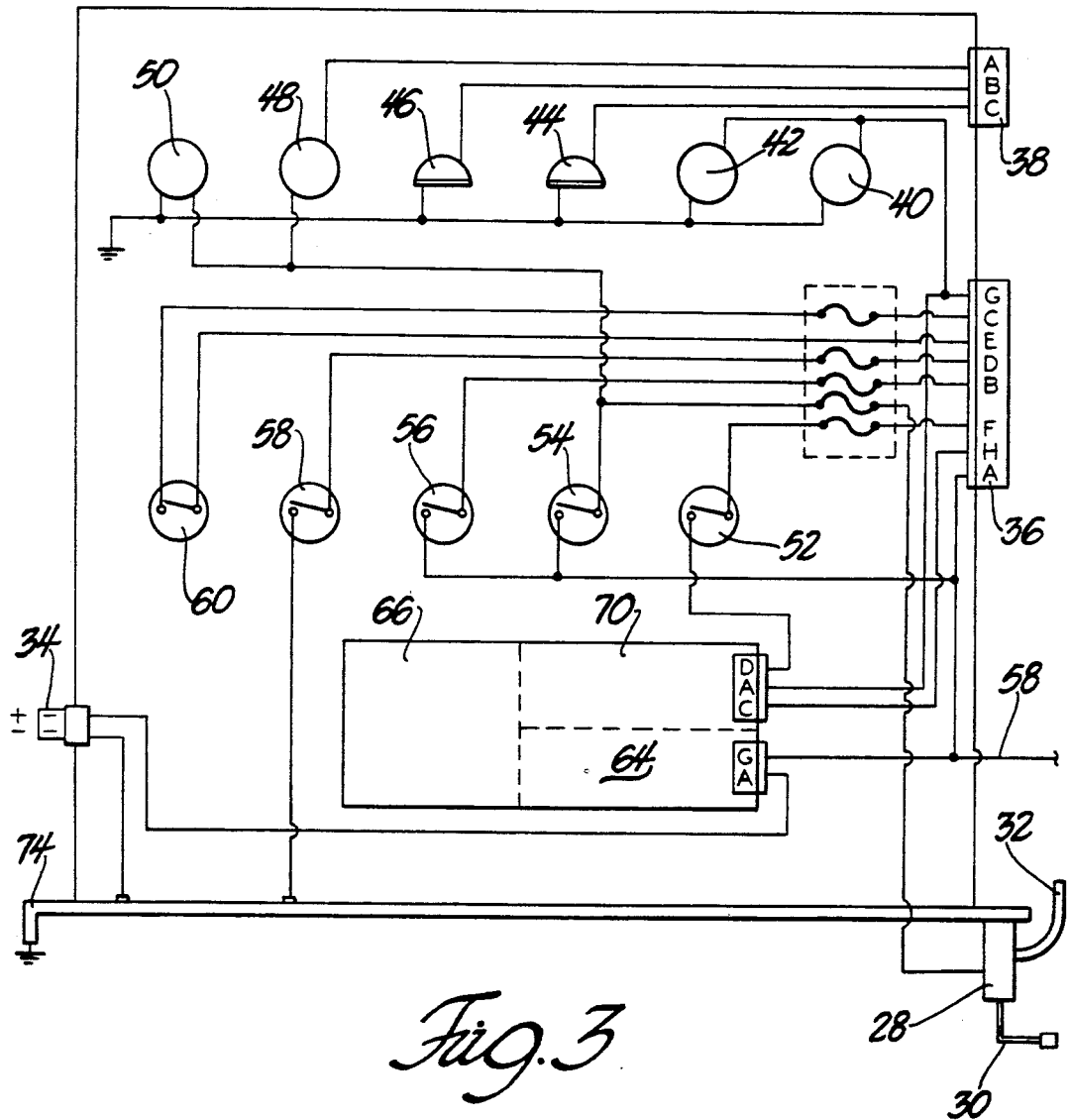
FIG. 3 is a schematic of a test kit according to this invention.

As shown in FIGS. 2 and 3, the test kit 22 has a first cannon plug 38 and second cannon plug 36 mounted on the housing 24. The first cannon plug 38 connects the APU 16 by means of a cable, not shown, to a bank of lights and gages similar to those located in the vehicle. The gages shown when viewed from right to left are: direct current voltage meter 40, battery charging ammeter 42, high temperature light 44, low oil pressure light 46, oil pressure gage 48 and a time totalizer 50. These gages provide a visual indication of how the APU 16 is functioning.

The second cannon plug 36 connects the APU 14 to a bank of switches and also connects the APU to the power input 34 of the test kit 22. Viewing the switches from right to left in FIG. 2 are a generator switch 52, a fuel pump switch 54, a fuel solenoid switch 56, a preheat switch 58, and a starting switch 60. The second cannon plug 36, also provides the connection for power from the external source to the APU.

FIG. 3 shows a schematic of a test kit according to this invention. The power connection 34 is adapted to be connected to an external source of power which is the same as the vehicle systems. In the case of military systems, this is 24 volts D.C. but it may be other voltages depending on the vehicles electrical system. The present invention assumes the availability of a 24 volt D.C. source however, a transformer-rectifier set could be included to provide the necessary power.

As shown the external power connection 34 is connected to the battery side 64 of voltage regulator 66 which is in turn connected to the APUs start solenoid by a cable 62 as shown in FIGS. 2 and 3. This connection will provide power to start the APU 14. The external power will provide the necessary power for testing and maintaining operation of the APU.

The voltage regulator 66 is also connected to the APU generator on the generator side 70. This connection is made through the second cannon plug 36. The connection to the voltage regulator 66 is made through the two position generator switch 52. When the generator switch 52 is closed, a relay (not shown) in the voltage regulator 66 is energized. This allows current from the APU generator to flow to the external source 34 and charge the batteries.

The fuel pump switch 54 will activate the auxiliary fuel pump 28 attached to the test kit. If the APU 16 has its own fuel pump, then the test kit pump provides additional pumping capacity if not then the test kit will provide all the pumping necessary. The fuel solenoid switch 56 is used in conjunction with the fuel pump switch 54. When the fuel solenoid switch 56 is closed, the fuel solenoid on the APU 14 is activated allowing fuel to flow to the APU fuel injectors. The fuel pump 28 provides fuel flow even if the APU has its own transfer fuel pump and provides fuel for engine testing. When the fuel solenoid switch 54 is opened, the APU fuel solenoid closes the APU fuel line which stops fuel flow in the engine and thereby the engine.

The preheat switch 58 and starter switch 60 act in concert: The preheat switch 58 is activated when the APU is to be started, activating the glow plugs in the APU to provide fuel ignition during the initial operating phase. After the APU begins to run, the glow plugs can be turned off. The starter switch 60 energizes the APU starter relay in the closed position to crank the APU and begin operation.

The switches 52, 54, 56, 58, and 60 are all routed through a fuse box 72 with one fuse for each switch. The fuses can be of the common vehicle configuration. The fuse box provides protection for the electrical systems as well as a convenient location at which wiring changes can be made to adjust the gage wiring to the cannon plug configuration of different APUs.

USE AND OPERATION

When using the test kit of this invention, the vehicle which has the malfunctioning APU is brought to the maintenance area. The test stand can be wheeled to the vehicle, the APU removed from the vehicle and the APU attached to the upright legs of the test stand. The test stand with attached APU can be moved as a unit to a convenient sheltered location for further work. The vehicle can be parked where convenient or can be operated using the main power plant for all its electrical and hydraulic power.

As described, the test kit does not have hydraulic function. Therefore, the hydraulic pump of the APU will be removed to prevent damage during repair.

Once the test stand and attached APU are at the work location, the first cannon plug from the APU is attached to the appropriate connector 38 of the test kit. This connects the gages and lights which correspond to the vehicle, lights and gages. During operation the gages and lights provide monitoring functions. Also if the gages and lights show no reaction to APU operation it may indicate a malfunctioning APU sensor which should be examined and replaced.

The second cannon plug is attached to its corresponding test kit connector 36 thereby attaching the various operating circuits of the APU to the test kit switches. The fuel line 32 is connected to the fuel pump 28 and the test kit ground 74 electrically connected to ground to protect the personnel and kit. The test kit is connected to a power source and the operation is ready to begin.

The preheat switch 58 is moved to the closed position and held on to start the glow plugs and the fuel pump switch 54 activated. If the APU is configured so it has its own transfer fuel pump then the fuel pump switch could remain off and the APU fuel pump utilized. When the glow plugs have been on the required preheat time, the fuel solenoid switch 56 is closed to allow fuel flow and the starter switch 60 closed. The starter will crank the APU and the APU should start. If it does not, the various components can be tested, replaced or adjusted. Once the APU has been started, the starter switch 60 and preheat switch 58, which are spring loaded, are released and return to the open position and the generator switch 52 closed. The APU generator will provide the necessary electrical energy to monitor charging functions.

As the APU operates the gages and lights on the test kit will show if the various functions are performing. The alternator out put will be shown on the volt meter and charging ammeter. If the voltage and amperage are within normal operating limits, the alternator can be safely assumed to be working proper and the battery charging system functioning. The oil pressure gage will indicate if the oil pump and oil distribution system are functioning properly, the time totalizer will provide the total operating time on the engine.

I wish it to be understood that I do not desire to be limited to the exact details of construction shown and described for obvious modifications will occur to a person skilled in the art, without departing from the spirit and scope of the appended claims.

I claim:

1. A test and repair test kit for an auxiliary power unit, the auxiliary power unit having first and second cables to provide electrical out put comprising: a housing; a first cannon plug mounted on the housing to receive the first cable to provide electrical signals from the auxiliary power unit representing the load percent current generated, oil pressure, direct current voltage generated, low oil pressure warning, time total signal, high temperature warning signal, and battery charging amperage, to individual monitoring gages relating to the various monitored engine functions; a second cannon plug mounted on the housing to receive the second electrical cable which provides electrical connections to the auxiliary power unit for the operating functions necessary to start and operate the auxiliary power unit the operating controls including a fuel pump switch, a glow plug switch, and a generator switch and each of the operating functions passing individually through one of the operating controls in the test kit which controls the function; an auxiliary fuel pump connected to a source of fuel and the auxiliary power unit fuel pump; a voltage regulator connected to an external source of power to provide starting and operating power to the APU.

* * * * *